(12) United States Patent
van Veldhoven

(10) Patent No.: US 11,722,146 B1
(45) Date of Patent: Aug. 8, 2023

(54) CORRECTION OF SIGMA-DELTA ANALOG-TO-DIGITAL CONVERTERS (ADCS) USING NEURAL NETWORKS

(71) Applicant: NXP B.V., Eindhoven (NL)

(72) Inventor: Robert van Veldhoven, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/648,584

(22) Filed: Jan. 21, 2022

(51) Int. Cl.
H03M 3/00 (2006.01)

(52) U.S. Cl.
CPC .................. H03M 3/344 (2013.01)

(58) Field of Classification Search
CPC .................................................... H03M 3/344
USPC .............................................. 341/143, 155
See application file for complete search history.

(56) References Cited

U.S. PATENT DOCUMENTS

| | | | | |
|---|---|---|---|---|
| 7,358,798 | B1 * | 4/2008 | Batruni | H03H 17/0261 327/552 |
| 7,394,413 | B2 * | 7/2008 | Batruni | H03M 1/0612 341/120 |
| 10,089,178 | B2 * | 10/2018 | Iljazi | G06F 3/0605 |
| 10,594,334 | B1 * | 3/2020 | Far | G06N 3/065 |
| 10,931,299 | B1 * | 2/2021 | Kinyua | H03K 3/0315 |
| 11,101,810 | B1 | 8/2021 | Veldhoven | |
| 11,438,007 | B2 * | 9/2022 | Kinyua | H03M 3/462 |
| 2004/0233091 | A1 * | 11/2004 | Clement | H03M 1/002 341/155 |
| 2005/0156775 | A1 * | 7/2005 | Petre | H03M 1/121 341/123 |
| 2007/0030189 | A1 * | 2/2007 | Batruni | H03M 1/1033 341/118 |
| 2011/0148682 | A1 * | 6/2011 | Rigby | H03M 1/188 341/155 |
| 2022/0019883 | A1 | 1/2022 | Veldhoven | |

OTHER PUBLICATIONS

Peng Xizhu et al: "A Neural Network-Based Harmonic Suppression Algorithm for Medium-to-High Resolution ADCs", 2021 5th IEEE Electron Devices Technology & Manufacturing Conference (EDTM), IEEE, Apr. 8, 2021 (Apr. 8, 2021), pp. 1-3, XP033913158, DOI: 10.1109/EDTM50988.2021.9420899, retrieved on Apr. 30, 2021.

Qiu Yongtao et al: "A Novel Calibration Method of Gain and Time skew Mismatches for Time-interleaved ADCs Based on Neural Network", 2019 IEEE MTT-S International Wireless Symposium (IWS), IEEE, May 19, 2019 (May 19, 2019), pp. 1-3, XP033598832, DOI: 10.1109/IEEE-IWS.8804030, retrieved on Aug. 15, 2019.

* cited by examiner

Primary Examiner — Jean B Jeanglaude

(57) ABSTRACT

Systems and methods for correction of sigma-delta analog-to-digital converters (ADCs) using neural networks are described. In an illustrative, non-limiting embodiment, a device may include: an ADC; a filter coupled to the ADC, where the filter is configured to receive an output from the ADC and to produce a filtered output; and a neural network coupled to the filter, where the neural network is configured to receive the filtered output and to produce a corrected output.

20 Claims, 5 Drawing Sheets

CORRECTION OF SIGMA-DELTA ANALOG-TO-DIGITAL CONVERTERS (ADCS) USING NEURAL NETWORKS

FIELD

This disclosure relates generally to electronic circuits, and more specifically, to systems and methods for correction of sigma-delta analog-to-digital converters (ADCs) using neural networks.

BACKGROUND

In electronics, an analog-to-digital converter (ADC) is a system that converts an analog signal, such as a sound picked up by a microphone or light entering a digital camera, into a digital signal. An ADC may also provide an isolated measurement such as an electronic device that converts an input analog voltage or current to a digital number representing the magnitude of the voltage or current.

There are several ADC architectures. Due to the complexity and the need for precisely matched components, all but the most specialized ADCs are implemented within integrated circuitry. These may take the form of mixed-signal integrated circuits ("ICs") that integrate both analog and digital circuits.

More specifically, an ADC converts a continuous-time and continuous-amplitude analog signal to a discrete-time and discrete-amplitude digital signal. The conversion involves quantization of the input, so it necessarily introduces a small amount of error or noise. Furthermore, rather than continuously performing the conversion, an ADC does the conversion periodically, sampling the input, thus limiting the allowable bandwidth of the input signal.

The performance of an ADC is primarily characterized by its bandwidth and signal-to-noise and distortion ratio (SNDR). The bandwidth of an ADC is characterized primarily by its sampling rate. The SNDR of an ADC is influenced by many factors, including one or more of: resolution, linearity, accuracy (how well the quantization levels match the original analog signal), aliasing, or jitter.

During the design, layout, and manufacturing of ICs, many errors may be introduced in an ADC. In the design phase, for example, errors may be introduced due to the non-linearity of the circuit components. ADCs may suffer from nonlinearity errors caused by their physical imperfections, resulting in their output deviating from a linear function (or some other function, in the case of a deliberately nonlinear ADC) of their input. These errors can sometimes be mitigated by calibration or prevented by testing. Important parameters for linearity are integral nonlinearity and differential nonlinearity. These nonlinearities introduce distortion that can reduce the SNDR ratio performance of the ADC and thus reduce its effective resolution. Errors may also be introduced in the layout phase due to unwanted parasitic effects. Moreover, during the manufacturing phase, errors may be introduced by mismatches in components, which can lead to additional non-linearities as well as offset and gain errors.

To correct these errors, a typical approach is to increase the layout area and power of the circuits in the ADC, and to spend considerable hours optimizing circuit designs and layouts, which is a very tedious process.

Another approach for correcting ADC errors is calibration. Unfortunately, a calibration approach for each different type of error is often required, which is accompanied by significant mathematical analysis and modeling, while also incurring an increase in hardware, and therefore area and cost. If different calibration methods are combined, convergence issues of different calibration loops might occur, leading to even more complexity.

In the measurement instrument and sensor markets, a crucial role is played by ADCs, which today represent a core of most digital equipment. Consequently, the operation of ADCs strongly affects the overall performance of the measurement or sensor apparatuses in terms of their metrological accuracy. To increase the performance of such instruments, it may be important either to design new ADCs with improved linearity and accuracy, or to develop suitable techniques for compensating for ADC errors.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
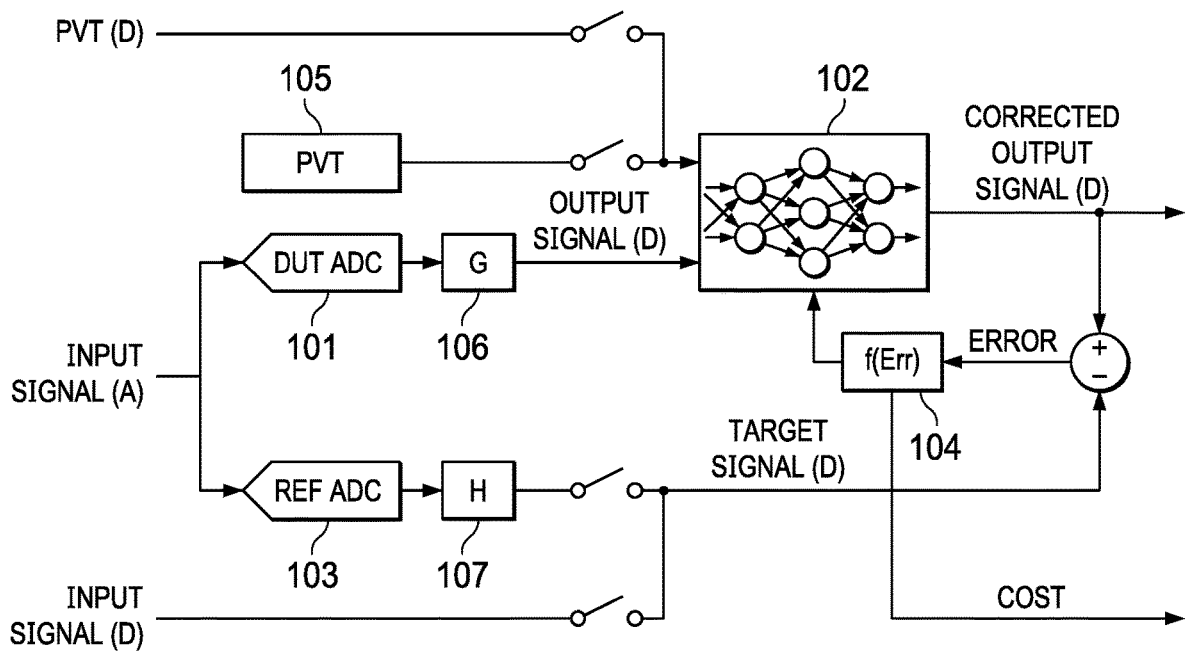
FIG. 1 is a block diagram of an example of a first system for correcting a sigma-delta analog-to-digital converter (ADC), shown in a training configuration, according to some embodiments.

Embodiments described herein provide systems and methods for compensating or correcting the output of analog-to-digital converters (ADCs), particularly delta-sigma ADCs, using neural networks. In various implementations, systems and methods described herein may significantly reduce one or more of: (i) an ADC's hardware complexity, by avoiding the requirements for mathematical analysis of each error; (ii) the need for an accurate error model to enable calibration (an error model would be required for each parameter to be calibrated, which may complicate calibration); or (iii) the need to implement circuitry usable to calibrate for analog circuit errors.

Generally, the addition of circuit elements to an ADC's analog circuitry would come at the cost of ADC performance because additional parasitics would be introduced. In contrast, systems and methods described herein may not require additional analog circuits to be added to an ADC, and therefore the ADC's performance is not compromised; to the contrary, it may be increased. Particularly, increased area for additional circuits is not needed to improve matching, and electrical current does not have to be increased to improve linearity. Moreover, if multiple parameters need to be calibrated, traditional calibration approaches might require a substantial increase in additional analog circuits to enable such calibration, whereas systems and methods described herein do not require additional analog circuits for calibration. Instead, digital hardware and a representative data set may be added.

Various disclosed embodiments disclosed herein may include one or more features such as, for example: (i) a direct feed of data from an ADC without a need for storage between the ADC and a neural network; (ii) a reduction of input word width from the ADC to the neural network without performance loss; and (iii) and the inclusion of process information to enable the neural network system to compensate for processes variations (e.g., temperature/voltage drifts and process shifts). In some cases, an ADC may be designed such that it has sufficiently low circuit noise, without necessarily optimizing it for non-linearities or other errors, and instead systems and methods described herein may utilize a neural network or other machine learning mechanisms to compensate for all such errors.

As used herein, the term "machine learning" refers to one or more algorithms that implement: a neural network (e.g., artificial neural network, deep neural network, convolutional neural network, recurrent neural network, autoencoders, reinforcement learning, etc.), fuzzy logic, artificial intelligence (AI), deep learning, deep structured learning hierarchical learning, support vector machine (SVM) (e.g., linear SVM, nonlinear SVM, SVM regression, etc.), decision tree learning (e.g., classification and regression tree or "CART," ensemble methods (e.g., ensemble learning, Random Forests, Bagging and Pasting, Patches and Subspaces, Boosting, Stacking, etc.), dimensionality reduction (e.g., Projection, Manifold Learning, Principal Components Analysis, etc.), or the like.

Non-limiting examples of publicly available machine learning algorithms, software, and libraries that may be utilized within embodiments of systems and methods described herein include, but are not limited to: PYTHON, OPENCV, INCEPTION, THEANO, TORCH, PYTORCH, PYLEARN2, NUMPY, BLOCKS, TENSORFLOW, MXNET, CAFFE, LASAGNE, KERAS, CHAINER, MATLAB Deep Learning, CNTK, MatConvNet (a MATLAB toolbox implementing convolutional neural networks for computer vision applications), DeepLearnToolbox (a Matlab toolbox for Deep Learning from Rasmus Berg Palm), BigDL, Cuda-Convnet (a fast C++/CUDA implementation of convolutional or feed-forward neural networks), Deep Belief Networks, RNNLM, RNNLIB-RNNLIB, matrbm, deeplearning4j, Eblearn.lsh, deepmat, MShadow, Matplotlib, SciPy, CXXNET, Nengo-Nengo, Eblearn, cudamat, Gnumpy, 3-way factored RBM and mcRBM, mPoT, ConvNet, ELEKTRONN, OpenNN, NEURALDESIGNER, Theano Generalized Hebbian Learning, Apache SINGA, Lightnet, and SimpleDNN.

Various systems and methods disclosed herein are described with respect to utilization of an artificial neural network (also simply referred to herein as a "neural network"). However, a person of ordinary skill in the art may choose to implement other appropriate machine learning systems, such as previously disclosed, for compensating for ADC errors, in accordance with embodiments of the present disclosure.

A neural network is typically based on a collection of connected units or nodes referred to as artificial neurons, which loosely model the neurons in a biological brain. Each connection, like the synapses in a biological brain, can transmit a signal to other neurons. An artificial neuron receives a signal, processes it, and communicates results to other neurons connected to it. In neural network implementations, the "signal" at a connection is a real number, and the output of each neuron is computed by some non-linear function of the sum of its inputs. The connections are referred to as edges. Neurons and edges typically have a weight that adjusts as training of the neural network proceeds. The weight increases or decreases the strength of the signal at a connection. Neurons may have a threshold such that a signal is sent only if the aggregate signal crosses that threshold.

Typically, neurons are aggregated into layers. Different layers may perform different transformations on their inputs. Signals travel from the first layer (the input layer) to the last layer (the output layer), possibly after traversing the layers multiple times. A neural network architecture may be configured as a feed-forward network with one or more hidden layers, and with a backpropagation learning algorithm.

Implementation of a neural network may involve three phases: a training or learning phase, a validation phase, and an inference or production phase. In the training phase, the neural network essentially learns by comparing its actual output with correct outputs (or at least outputs that are nearer a desired output) to find errors. It then modifies the model accordingly. In the validation phase, the trained neural network is verified by means of data ("validation set"), which may be different from the data used in the training phase. In the inference or production phase, the trained and validated neural network is now configured and capable of providing outputs that correspond to any input.

In various embodiments, systems and methods described herein may provide ADC circuitry that implements an ADC in combination with a neural network that has been trained to learn what an ADC's errors are, and to learn how to compensate for the errors. As referred to herein, ADC errors may be any type of distortion caused by circuitry within an ADC that results in its digital output signal not being a true or "ideal" digital conversion of the input analog signal. Such analog-to-digital conversion errors may be caused by non-linearities within the ADC circuitry, or any other defects or processing parameters that can produce such ADC errors, which may take the form of noise, distortion, harmonics, etc.

Generally, an ADC may be any type of ADC implemented within any type of device or circuitry that utilizes an ADC. In many implementations, however, an ADC as described herein may be a sigma-delta ADC. As used herein, the term "delta-sigma ADC" generally refers to an ADC that includes, in addition to some analog circuitry, an oversampling (or "sigma-delta") modulator followed by a digital/decimation filter that produces a digital data stream output.

In a sigma-delta ADC, the sigma-delta modulator uses noise shaping to reduce the quantization noise in a particular band anywhere between 0 and fs/2, where "fs" is its sampling rate. Noise shaping lowers the in-band quantization noise to result in a high signal-to-noise ratio (SNR) in the signal bandwidth. The shaped quantization noise, which is out-of-band, may be eliminated by the decimation filter that comes after the sigma-delta modulator.

The use of a neural network as a post-correction stage involves the neural network storing "anti-errors" in the neural network. In case of distortion caused by non-linearity of the circuitry in the ADC, the neural network during training learns a non-linear function to correct for that distortion; that is, the neural network operates as a non-linear transfer function.

In Nyquist ADCs, certain of the techniques described herein may be used as a post-correction stage, because usually Nyquist converters have a white noise floor (noise density is frequency independent between 0-fs/2) and back-and-forth folding is not an issue (unless there are other signals in the spectrum that should not fold). In sigma-delta ADCs, however, this is not the case. Although non-linearity in the neural network may be used to correct for distortion of the ADC's sigma-delta modulator, the same non-linearity may also cause fold-back of quantization noise back to the signal bandwidth, thus making the noise shaping less effective.

In the figures that follow, neural networks may be implemented with any type of hardware and/or software (as will be further disclosed herein), such as within an appropriate set of digital circuitries suitable for implementation of a neural network. The illustration of neural networks within the figures is not to be limiting upon the scope of embodiments of the present disclosure. Within the various figures, "(A)" represents that the signal is an analog signal, and "(D)" represents that the signal is a digital signal.

FIG. 1 is a block diagram of an example of a first system for correcting device-under-test (DUT) sigma-delta ADC 101, here shown in a training configuration. In various embodiments, DUT sigma-delta ADC 101 may have an internal delta-sigma modulator in series with a digital filter. As such, DUT sigma-delta ADC 101 may use noise shaping to shape the quantization noise of a low bit-count quantizer to higher frequencies.

Because of the low bit-count quantizer, however, significant quantization noise may be introduced. The internal digital filter may shape the quantization noise to moved most of it out of the signal bandwidth. Although the internal digital filter's shaping reduces in-band noise, it also increases noise outside the signal band of interest, which would ordinarily cause a problem in neural network post-correction: due to non-linearity, the out-of-band quantization noise folds back into the signal's band. For example, second and third order distortion causes intermodulation (e.g., intermodulation products) of out-of-band quantization noise, causing quantization noise to fold back into the signal bandwidth.

To avoid this fold back, filter G 106 may be coupled between the output of DUT sigma-delta ADC 101 and neural network 102. The output of DUT sigma-delta ADC 101 (or any other ADC that has significant out-of-band frequency content) is filtered by filter G 106. Any noise or other out-of-band frequency content may be reduced or removed by filter G, to a level where no significant quantization noise or out-of-band signal content fold back occurs, and to a level where the learning process of neural network 102 is not significantly disturbed.

Filter G 106 may be a finite impulse response ("FIR") filter or an infinite impulse response ("IIR") filter. Filter G 106 may be a low-pass, bandpass, or high-pass filter, depending on the input signal used during the training phase. The gain of filter G 106 may be selected at the training frequency (or frequencies). In the case of a sine wave input, filter G 106 may be configured to pass the fundamental harmonic of the input signal, and to block all higher order harmonics. The function of filter G 106 may be changed depending on the frequency of the input signal and harmonics. For example, if the frequency of the input signal is reasonably high, a bandpass filter may be used to remove the low and high frequency noise and the signal harmonics. Filter G 106 may be a programmable filter that would be configured to allow for a frequency dependent training of the neural network 102.

During a training phase, a representation of an output from reference ADC 103 (labeled "target signal") may be used to train neural network 102 for compensation of the output signal of DUT sigma-delta ADC 101. The target signal may be provided by hardware-implemented reference ADC 103 also receiving the same analog input signal (or an equivalent digital input signal) as DUT sigma-delta ADC 101. If reference ADC 103 is also a sigma-delta ADC, it may also be coupled to filter H 107. Moreover, if DUT sigma-delta ADC 101 and reference ADC 103 have the same out-of-band quantization noise error, filters G 106 and H 107 may be different instances of the same filter.

Hardware implemented reference ADC 103 may be preselected as known to be substantially accurately calibrated (e.g., with a desired minimum set of errors in converting an analog signal to a digital signal, or at least fewer errors than produced within DUT sigma-delta ADC 101). The equivalent digital input signal may be configured to be a representation of an output of a reference ADC without errors (or with fewer errors than DUT sigma-delta ADC 101). If it is known that the DUT sigma-delta ADC 101 and reference ADC 103 have different propagation delays, appropriate circuitry may be added to compensate for such differences.

Neural network 102 may be trained using error signals, which are the differences between corrected output signals from neural network 102 and the target signal. To accomplish this, the target signal is subtracted from the corrected output signal of neural network 102 using a comparator, or the like. The error signal produced is passed through cost function 104 used to train neural network 102 (e.g., using backpropagation or similar algorithms). Backpropagation computes the gradient in weight space of a feedforward neural network, with respect to a loss function. Using backpropagation, computational parameters (e.g., weights and/or biases) of neural network 102 are adapted (e.g., following a steepest descent method, also known as gradient descent). However, other suitable cost functions and training algorithms may be utilized for training the neural network.

The training phase may be continuously, or repeatedly, performed until the corrected output signal of neural network 102 has minimum errors (or at least a desired set of fewer errors) as compared to the target signal after completion of the training phase. One manner by which the error can be measured is with a Fast Fourier Transform (FFT) to check distortion in the spectrum of the corrected output signal. Alternatively, a cost output may be used to determine when the error is reduced to an acceptable level.

Whenever hardware implemented reference ADC 103 is too expensive to be implemented on-chip or too cumbersome to have available at final test, it may be replaced by a digital input signal for use as the target signal. The digital input signal is synchronized with the analog input signal. The digital input signal may be selected to represent an output from a reference ADC that contains fewer analog-to-digital conversion errors (e.g., due to non-linearities or other forms of distortion) than DUT sigma-delta ADC 101. The digital input signal may also be selected so that the error signal does not become too large for the training phase to adjust the weights and biases of neural network 102 efficiently or satisfactorily.

Training of the neural network 102 can be performed under different scenarios. For example, the training phase may be performed for each individual DUT sigma-delta ADC 101 (e.g., for each integrated circuit or "IC" containing DUT sigma-delta ADC 101, or separately for each of multiple ADCs implemented on a single IC). This approach yields a neural network specifically trained for each DUT sigma-delta ADC. Because of variations in the manufacturing of each individual ADC, training of neural network 102 for a given ADC may not work equally well for another ADC, and in such instances, the other ADC may be at least partially re-trained.

In some cases, the training phase can be performed on a batch of multiple DUT sigma-delta ADCs (e.g., on multiple ICs, each containing a DUT sigma-delta ADC). In this way, trained neural network 102 generalizes errors into one model; i.e., the neural network knowledge base after training. Such a knowledge base is representative of all errors present in the batch of multiple ADCs, and it may represent and compensate for errors that generalize well across multiple ADCs.

In other implementations, one or more Process-Voltage-Temperature (PVT) parameters 105 may be optionally incorporated so that the neural network 102 can further compensate the output of DUT sigma-delta ADC 101.

Process variation accounts for deviations in semiconductor fabrication processes. These process variations may be due to variations in the manufacturing conditions, such as temperature, pressure, and dopant concentrations. Voltages (e.g., supply voltage, reference voltage, bias condition on a device) utilized within an IC can vary from the established designed value during day-to-day operation and over its lifetime, which can affect the operation of circuit components in an ADC. And, when an IC is operating, the temperature can vary throughout the IC, which affects the operational parameters of various circuit components.

For example, analog circuits, such as implemented for incorporation of ADCs, are known to be voltage and/or temperature dependent. Accordingly, in some cases, voltage-temperature (VT) corner information may be provided to neural network 102 as an input to enable neural network 102 to correct for voltage and/or temperature drifts that can cause errors in the operation of DUT sigma-delta ADC 101, so that neural network 102 can further compensate for such voltage and/or temperature drifts.

Moreover, temperature and voltage information are often readily available on ICs. For example, an IC where DUT sigma-delta ADC 101 is implemented may include temperature and/or voltage sensors whose outputs can be input into neural network 102 along with the output of DUT sigma-delta ADC 101. As a result, when neural network 102 is trained, cost function 104 accounts for the effects on the errors caused by such processing inputs to be utilized for adjusting the weights and biases within the nodes of neural network 102.

Other types of process-related information may be added as a PVT Input to neural network 102, such as various technology parameters (e.g., electron mobility, transistor parameters (e.g., Vt, fT, Beta, doping), resistor parameters (e.g., nominal resistor value, voltage dependency), or capacitor parameters (e.g., nominal capacitor value, voltage dependency). If there is a way to measure a process-related parameter, then the output of this measurement can be provided as a PVT Input to neural network 102.

Even if a particular PVT parameter cannot be measured on the IC, so long as it may be obtained from wafer measurements, the PVT parameter may be stored in a memory device (not shown) on the IC or supplied from an external source (e.g., an external memory device or a microprocessor or microcontroller) as a digital PVT input into neural network 102. Furthermore, neural network 102 may be trained based on all available PVT parameters or any desired subset of one or more PVT parameters for a particular ADC or a batch of ADCs.

In a validation phase following the training phase, an analog input signal may be input to DUT sigma-delta ADC 101 and reference ADC 103 to check if the error is now sufficiently small or at least reduced for a set of inputs that DUT sigma-delta ADC 101 may encounter. In some cases, the validation phase may be utilized on one or more batches of ADCs to determine if another batch of ADCs would be satisfactorily compensated by a trained neural network 102. Moreover, if neural network 102 was trained with one or more PVT parameters 105 or signal(s), these may again be utilized in the validation phase.

The validation process may check whether neural network 102 has properly learned to correct the non-linearity of DUT sigma-delta ADC 101. One or more input signals may be provided to DUT sigma-delta ADC 101 and to reference ADC 103, the output of filter G 106 as processed by neural network 102 is compared to the output of filter H 107, and the error signal is monitored. The output signal and the target signal (D) should be properly aligned to prevent the error signal from containing too much input signal. Additionally, or alternatively, one or more input signals may be provided to DUT sigma-delta ADC 101, and, through an FFT, it is judged if the output signal of neural network 102 is good enough (e.g., by looking at the distortion/intermodulation or noise floor). In that case, reference ADC 103 (or any other target signal source), filter H 107, and cost function 104, are not needed.

In some cases, such as when the training of DUT sigma-delta ADCs 101 is performed in a single sample training process (not in batches of ADCs), the validation phase may be omitted, and the inference phase described below may be sufficient.

Figure 2:
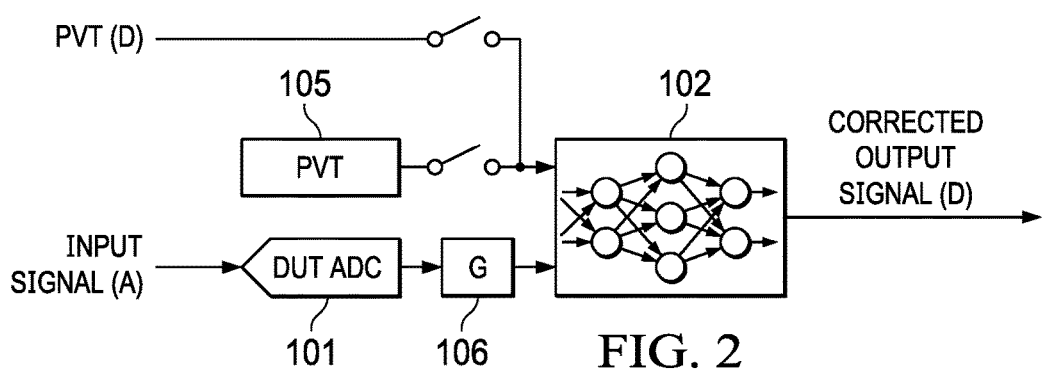
FIG. 2 is a block diagram of an example of the first system operating during an inference phase, according to some embodiments.

FIG. 2 is a block diagram of an example of the first system operating during an inference phase. In some embodiments, FIG. 2 illustrates the inference or production phase whereby the ADC circuitry (i.e., DUT sigma-delta ADC 101, filter G 106, and neural network 102) are implemented (e.g., on an IC) for operation within a final end-use application (e.g., the end-use application of the IC).

During the inference phase, an analog input signal may be applied to DUT sigma-delta ADC 101, which produces a digital output signal filtered by filter G 106 and then modified by trained neural network 102 to produce a compensated or calibrated corrected output signal (which may be utilized by another circuit within the IC).

The inference phase of FIG. 2 may also be utilized for the final production testing of trained neural network 102. For example, the output of neural network 102 may be checked by comparing it to specification parameters of the sigma-delta ADC 101. In addition, as described with respect to FIG. 1, training neural network 102 may be operated to account for one or more PVT parameters 105 during the inference phase.

It should be noted that, during the inference phase, the presence of filter G 106 is still required to avoid out-of-band quantization noise to fold back. In any of the three phases mentioned above, however, filter G 106 may alternatively be implemented as part of the sigma delta ADC's internal decimation filter. Additionally, or alternatively, the decimation itself (i.e., sample rate reduction) may be performed just after filter G 106 (in this case, filter G 106 is the decimation filter) or just after neural network 102. Finally, the training of neural network 102 may be performed while sigma-delta ADC 101 is being used in the inference phase; during operation, a proper target signal may be provided for training.

Figure 3:
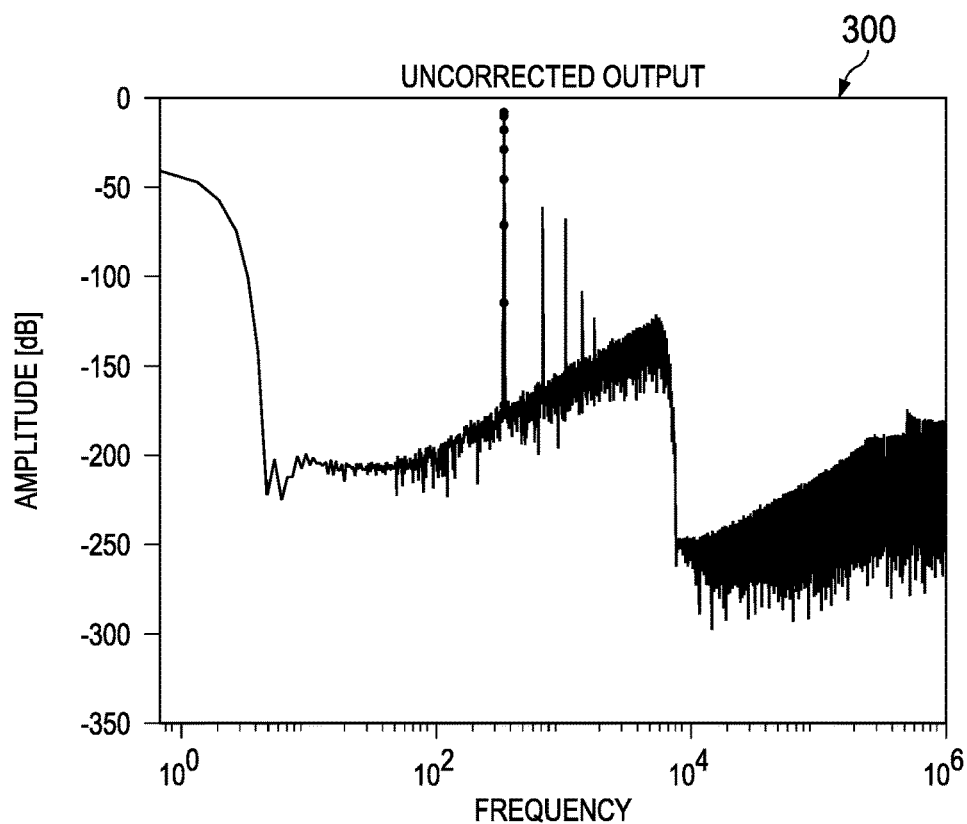
FIG. 3 is a graph of an example of an uncorrected sigma-delta ADC output signal, according to some embodiments.
Figure 4:
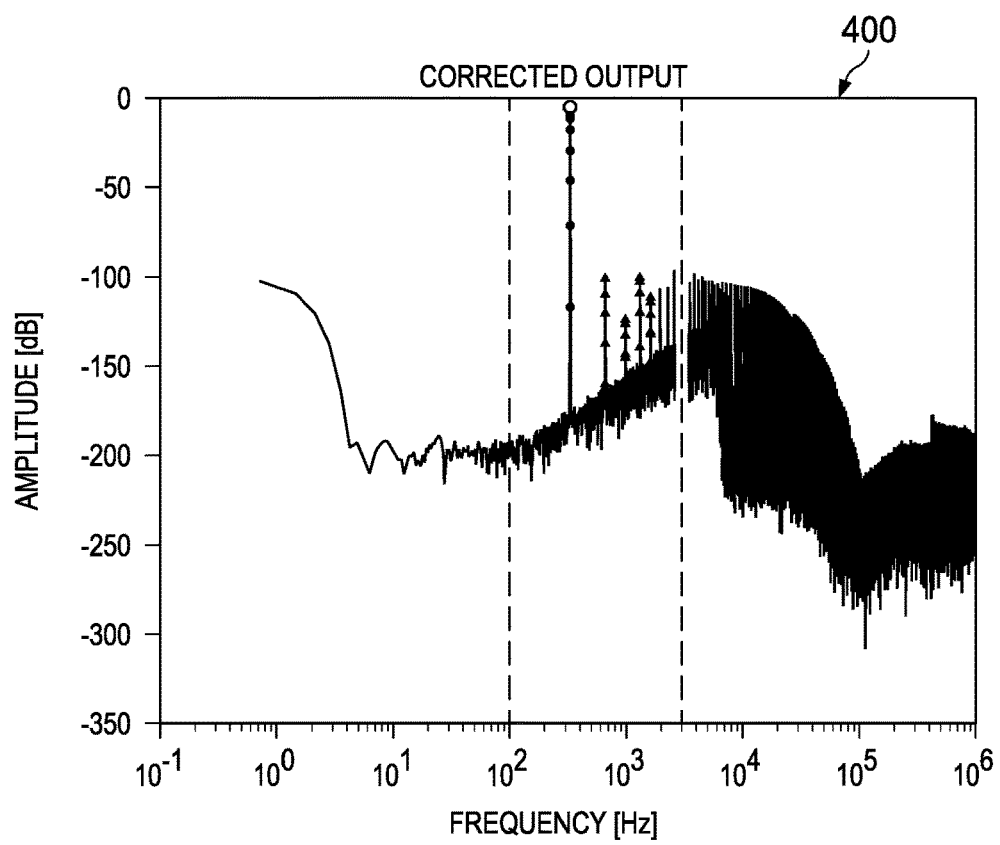
FIG. 4 is a graph of an example of a corrected sigma-delta ADC output signal produced by the first system, according to some embodiments.

FIG. 3 is a graph of an example of uncorrected sigma-delta ADC output signal 300. In uncorrected signal 300, the Total Harmonic Distortion (THD) is −51 dB and the SNR at 3 kHz is 106 dB. In contrast, FIG. 4 is a graph of an example of corrected sigma-delta ADC output signal 400 produced by the first system operating in inference mode, as shown in FIG. 2. In corrected signal 400, the THD is −86 dB and the SNR at 3 kHz is 105.3 dB. As such, use of systems and methods described herein improved the THD of the ADC's output signal by about 35 dB while the noise floor remained approximately the same. In many cases, results may be further improved through more extensive training time.

In the first system, neural network 102 provides a fully corrected DUT sigma-delta ADC 101 output. A feature of such a system is that neural network 102 is configured to provide the full dynamic range of the corrected DUT ADC. In contrast with this approach, however, is also possible for neural network 102 to predict only the error of a DUT ADC, which may then be subtracted from the uncorrected DUT ADC's output (e.g., using a comparator) to yield a corrected DUT ADC output. To illustrated this, FIGS. 5 and 6 show a second system with less hardware being required for neural network 102, as it is configured to predict only the error.

Figure 5:
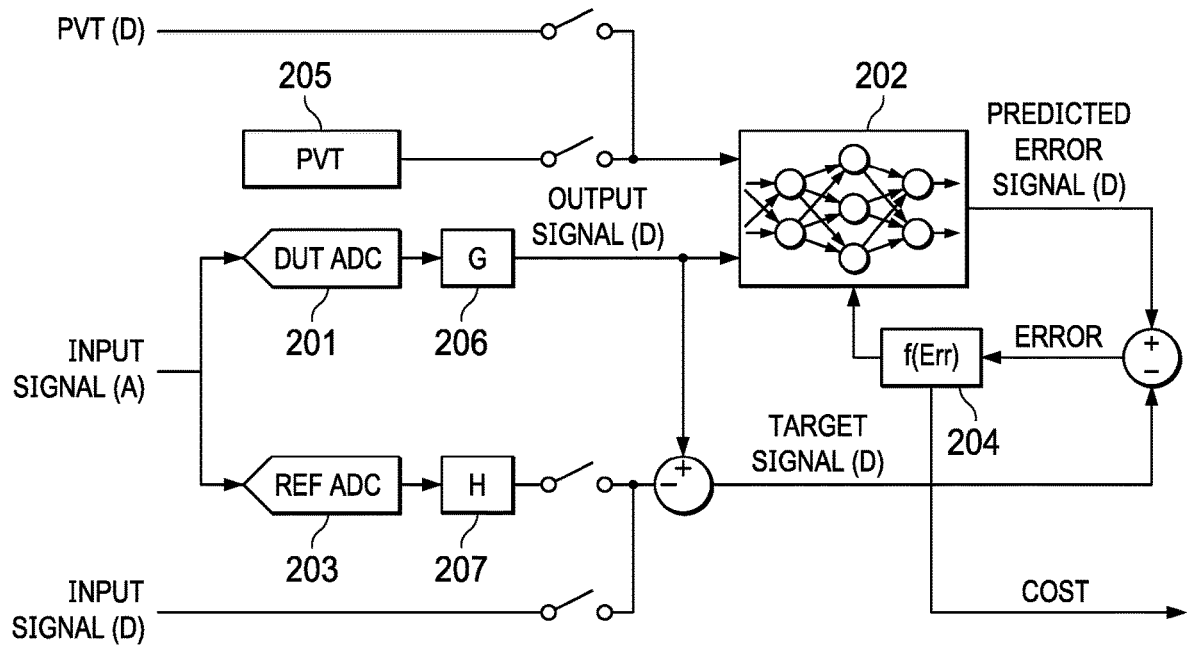
FIG. 5 is a block diagram of an example of a second system for correcting a sigma-delta ADC, shown in a training configuration, according to some embodiments.
Figure 6:
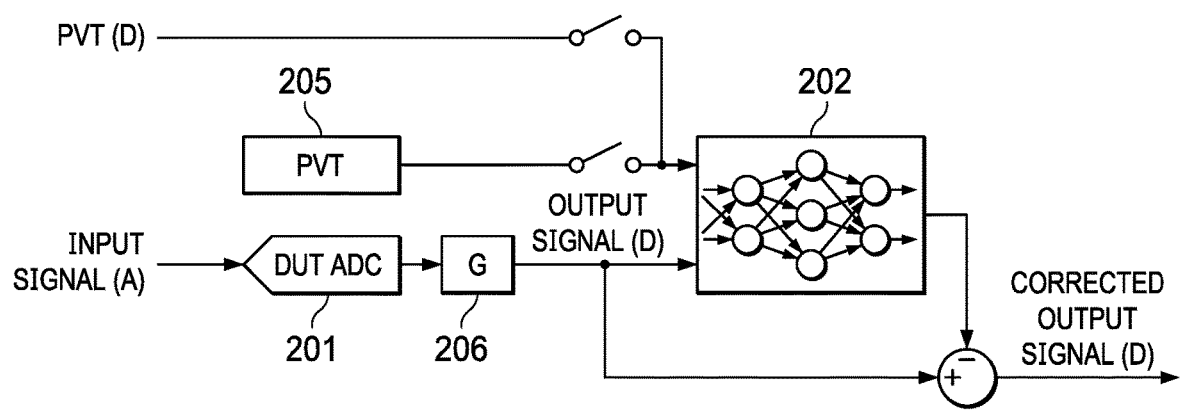
FIG. 6 is a block diagram of an example of the second system operating during an inference phase, according to some embodiments.

FIG. 5 is a block diagram of an example of a second system for correcting DUT sigma-delta ADC 201, shown in a training configuration. In this embodiment, neural network 202 is trained by the difference between the filtered output signal of DUT sigma-delta ADC 201 (i.e., without compensation by neural network 202), which may be performed using a comparator, and the output of reference ADC 203. This difference, here labeled a target signal, is then subtracted from a predicted error signal output of neural network 202, which is then processed through cost function 204 to train neural network 202 (e.g., using backpropagation or similar algorithms).

This approach for training of neural network 202 results in neural network 202 only needing to provide the error, and thus does not have to provide the complete DUT sigma-delta ADC 201's dynamic range (or codes), which may require less hardware for implementation of neural network 202, as fewer nodes are needed (because the errors made by DUT sigma-delta ADC 201 usually only span the lower significant bits or "LSBs" of the DUT sigma-delta ADC 201's output. Therefore, the output word width (and internal calculation word widths) of neural network 202 may be made smaller, since it is only compensating for the distortion within DUT sigma-delta ADC 201.

As described above, filter G 206 may be coupled between the output of DUT sigma-delta ADC 201 and neural network 102 to prevent fold back. If reference ADC 203 is also a sigma-delta ADC, it may also be coupled to filter H 207. One or more PVT parameters 205 may be incorporated so that the neural network 202 can further compensate the output signal of DUT sigma-delta ADC 201, to the extent PVT variations can cause errors in the operation of DUT sigma-delta ADC 201. Incorporation of PVT parameters 205 or a digital PVT Input signal may be performed in a manner as similarly described with respect to FIG. 1.

The training phase configuration of FIG. 5 may be applied to a single ADC or to a batch of ADCs. As in FIG. 1, a digital input signal replaces reference ADC 203, in which an equivalent digital input signal may be configured to be a representation of an output of a reference ADC with no errors, or at least fewer errors than DUT sigma-delta ADC 201.

During validation, an analog input signal is input to DUT sigma-delta ADC 201 and reference ADC 203 to check if the error is now sufficiently small or at least reduced for a set of inputs that DUT sigma-delta ADC 201 is designed to encounter. The validation phase may be performed in a manner as similarly described above, for example using an FFT or the like. Again, a validation phase may be utilized when training has been performed on one or more batches of ADCs to determine if another batch of ADCs would be also satisfactorily compensated by trained neural network 202. In some embodiments, reference ADC 203 may be replaced by a digital input signal.

In accordance with certain embodiments of the present disclosure, in instances where training of ADCs is performed in a single sample training process (i.e., not in batches of ADCs), the validation phase may be omitted, and the inference phase described below may be sufficient. If the neural network 202 was trained with one or more PVT parameters 205, these may be utilized within the validation phase.

FIG. 6 is a block diagram of an example of the second system operating during an inference phase. In some embodiments, the configuration of FIG. 6 may be used for the final production testing of DUT sigma-delta ADC 201 and within the end-use application of an IC in which DUT sigma-delta ADC 201 is implemented. Particularly, a predicted error output from neural network 202 may be subtracted from the output signal of the DUT sigma-delta ADC 201 201, as filtered by filter G 206, to provide a compensated, corrected output signal. In some cases, neural network 202 may be operated to account for PVT parameters 205 during the inference phase.

Figure 7:
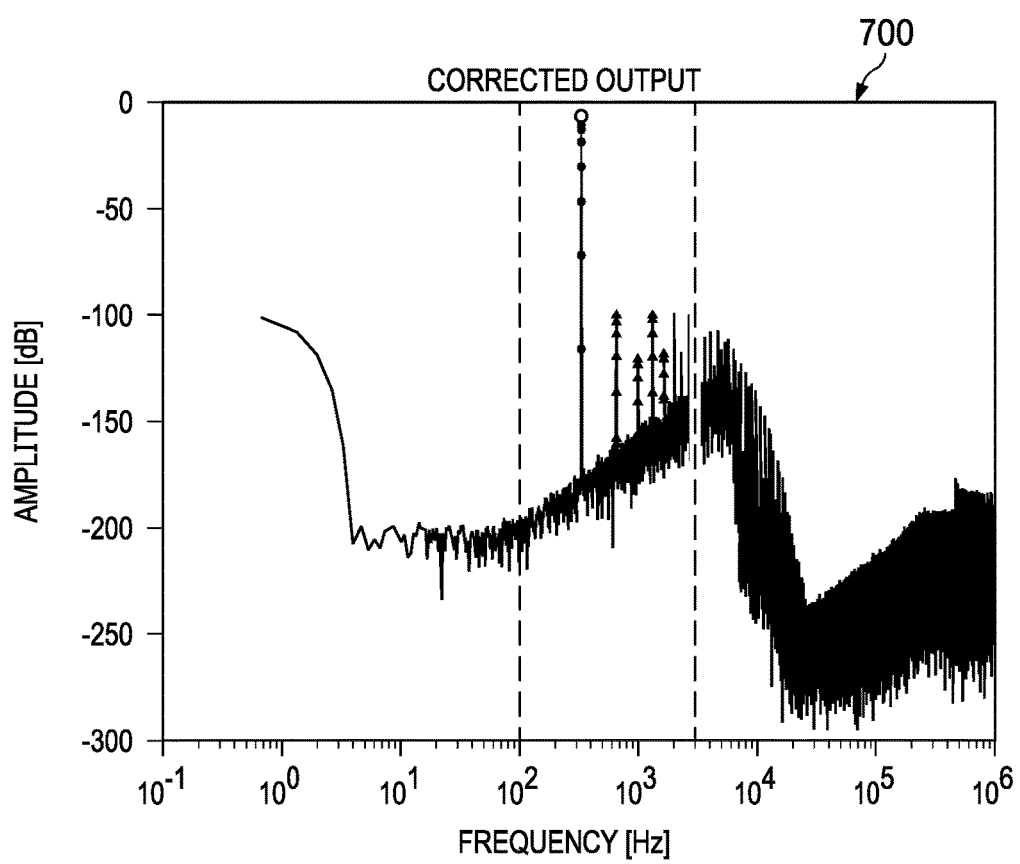
FIG. 7 is a graph of an example of a corrected sigma-delta ADC output signal produced by the second system, according to some embodiments.

FIG. 7 is a graph of an example of corrected sigma-delta ADC output signal 700 produced by the second system, according to some embodiments. In corrected signal 400, the THD is also −86 dB, and the SNR at 3 kHz is still 105.3 dB, compared to uncorrected signal 300 of FIG. 3. Again, by using systems and methods described herein, THD improved by about 35 dB while the noise floor remained approximately the same.

The performance of a compensated ADC (e.g., DUT ADC 101/201 combined with neural network 102/202) is not superior to that of a reference ADC (e.g., 103/203). Also, implementing a reference ADC on-chip may sometimes not be practical, insofar as doing so obviates the need for a DUT ADC and neural network in the first place, and would generally require more area, power, and design time, than a lower performing ADC with a neural network post-compensator (except when one high-performance, large area, high-power reference ADC is used to calibrate multiple small area, low power DUT ADCs using neural networks).

In some cases, to address these concerns, as an alternative approach the reference ADC may be disposed on a test board during final test. However, a high-performance reference ADC on a Printed Circuit Board (PCB) test board in a test environment can create interference issues. Furthermore, such an approach may also lead to other practical problems such as getting the reference ADC output bits into the chip under test, as it needs to connect to the neural network. Conversely, the DUT ADC may come off the chip to enable off chip training of the neural network, and neural network parameters may be loaded on the chip under test after training. Yet, when the ADCs are high resolution or high speed, this alternative approach can produce additional issues, including the need for many interfaces, and high-speed interfaces.

In some implementations, clock synchronization of the ADCs may also be an issue. The input signal of the reference ADC and DUT ADC should be synchronized. Due to parasitic poles on the PCB or on-chip, phase differences can occur, which can lead to errors in the constructed error signal fed to the back propagation algorithm. Furthermore, the DUT ADC and reference ADC both need the same high quality input signal. Connecting this signal in two different places may result in yet additional challenges. For example, if the reference ADC were needed during final test of a product, it would have to be placed to be on the tester load board where PCB space is expensive or unavailable.

To address these, and other concerns, additional embodiments may replace the reference ADC (e.g., 103/203) with another digital filter. The second digital filter (F) may be used to filter away the harmonics and excessive noise coming from a DUT ADC, such that the DUT ADC's input signal may be reconstructed in the digital domain. The difference between the reconstructed sine wave output by the second filter and the DUT ADC output may be fed to the back propagation algorithm. To produce a reconstructed reference signal, the second filter may be a low-pass, band-pass, or high-pass filter.

Figure 8:
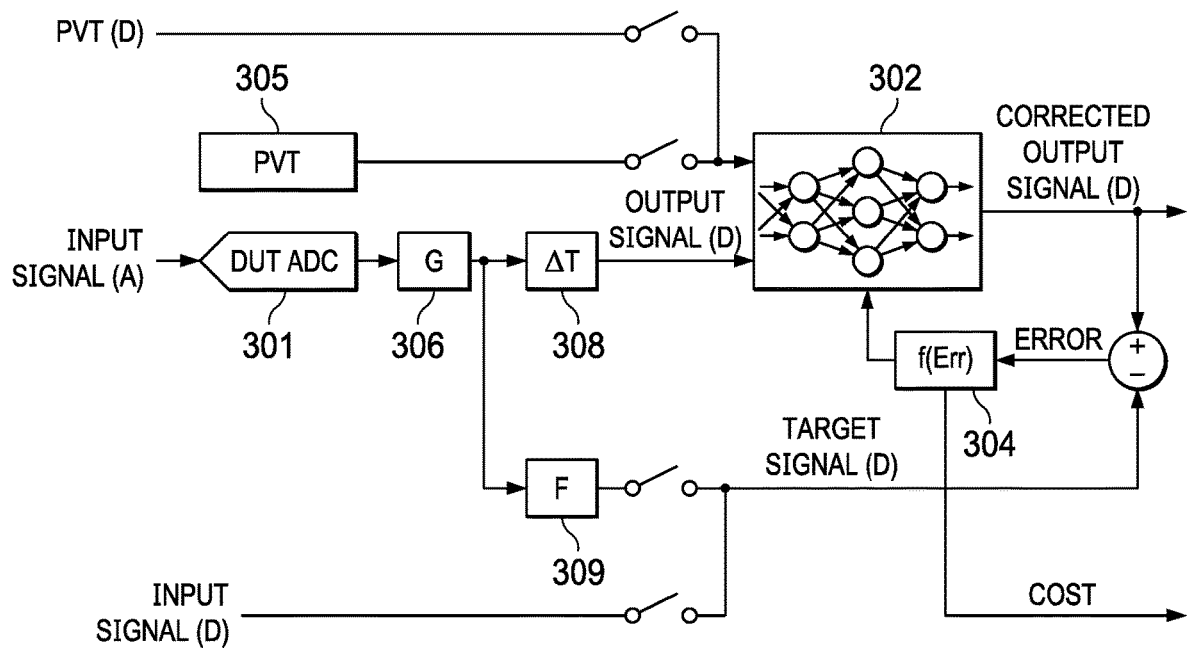
FIG. 8 is a block diagram of an example of a third system for correcting a sigma-delta ADC, shown in a training configuration, according to some embodiments.

FIG. 8 is a block diagram of an example of a third system for correcting DUT sigma-delta ADC 301, shown in a training configuration. In this embodiment, reference ADC 103/203 is replaced by filter F 309, which filters the output of filter G 306. To compensate for the delay in filter F 309, the signal from filter G 306 to neural network 302 is delayed by ΔT using delay circuit 308, which may be configured with a fixed delay or a frequency-dependent delay. In this way, the signal coming out of neural network 302 is properly synchronized to the target signal. If filter F 309 cannot be connected to the output of filter G 306, filter F 309 may instead be connected directly to the output of the DUT sigma-delta ADC 301. Also, one or more PVT parameters 305 may be incorporated so that neural network 302 can further compensate the output of DUT sigma-delta ADC 301.

Filter F 309 is used to substantially filter out the harmonics produced by DUT sigma-delta ADC 301 during conversion of the analog input signal, which reconstructs the input signal. Essentially, the output of the filter F 309 represents an "ideal" digital signal that normally would be produced by a reference ADC that produces fewer conversion errors than DUT sigma-delta ADC 301. In other words, filter F 309 may be configured to produce a sine wave at its output that sufficiently represents an output of a reference ADC that produces a desired amount of fewer conversion errors than DUT sigma-delta ADC 301. This can be done by designing the parameters of filter F 309 so that it filters out an amount of distortion (e.g., harmonics or excessive noise) that neural network 302 is to be trained to compensate for.

In some embodiments, a quantizer may be introduced after filter F 309 to reduce the amount of output bits, as filter F 309 may be long depending on pass-band/stop-band requirements, leading to large word widths, and therefore result in additional hardware implemented within neural network 302. Quantization, in digital signal processing, is a process of mapping input values from a large set to output values in a (countable) smaller set, often with a finite number of elements. A quantizer may be any device that is configured to perform a desired quantization (e.g., truncating, rounding, scaling, a highest number of bits, a lowest number of bits, etc.). As such, one or more quantizers may be used throughout the system to limit word widths, thus saving hardware. In some cases, to reduce hardware cost, the number of bits coming out of filter G 306 may also be quantized.

It should be noted that filter G 306 may reduce requirements on filter F 309, as filter G 306 already removes the out-of-band quantization noise, to negligible levels, and filter F 309 only needs to make sure harmonics and possibly in-band noise is removed to create a good enough reference signal for training. Furthermore, filters G 306 and F 309 both may be ran at the ADC clock frequency or a decimator may be coupled to the output of filter G 306.

A validation phase may be performed similarly as previously described, where an analog input signal is provided to DUT sigma-delta ADC 301 to check if the error is now sufficiently small or at least reduced for a set of exemplary inputs that DUT sigma-delta ADC 301 may encounter. Where the training of ADCs is performed in a single sample training process (i.e., not in batches of ADCs), the validation phase may be omitted.

During an inference or production phase, components 304, 308, and 309 may be removed, and the same configuration of FIG. 2 may be used. During this inference phase, an analog input signal is applied to DUT sigma-delta ADC 301, which produces a digital output signal that is then modified by the trained neural network 302 to produce a compensated or calibrated corrected output signal, which may then be utilized by other circuitry.

Figure 9:
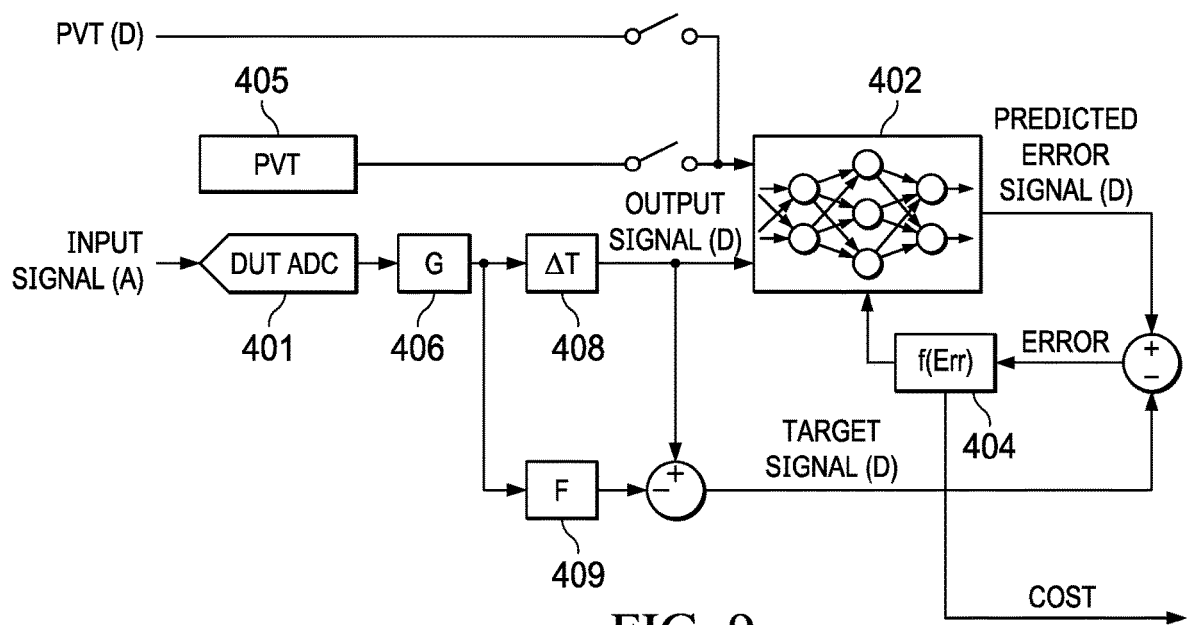
FIG. 9 is a block diagram of an example of a fourth system for correcting a sigma-delta ADC, shown in a training configuration, according to some embodiments.

FIG. 9 is a block diagram of an example of a fourth system for correcting DUT sigma-delta ADC 401, shown in a training configuration. In this embodiment, neural network 402 provides DUT sigma-delta ADC 401's error only. Neural network 402 is trained by the difference between: (a) the output signal of DUT sigma-delta ADC 401 (i.e., without compensation by neural network 402), as filtered by filter G 406 and time-delayed by delay circuit 408, and (b) the output of filter F 409. This difference, labeled as the target signal, is then subtracted from the predicted error signal output from neural network 402 to produce an error signal, which is processed through cost function 404 to train neural network 402. Again, one or more PVT parameters 405 may be incorporated so that neural network 402 can further compensate the output of DUT sigma-delta ADC 401.

In some cases, the target signal may be provided by blocking the fundamental frequency with a bandpass filter, which provides the error signal directly, instead of subtracting the signal from filter F 409 from the output of delay circuit 408. Depending on the analog input signal, such a filter may be band stop, low-pass (for very high frequency input signals), bandpass, or high-pass (for very low frequency input signals).

A validation phase may be performed similarly as previously described, where an analog input signal is provided to DUT sigma-delta ADC 401 to check if the error is now sufficiently small or at least reduced for a set of exemplary inputs that DUT sigma-delta ADC 401 is likely to encounter. Where the training of ADCs is performed in a single sample training process (i.e., not in batches of ADCs), the validation phase may be omitted.

During an inference or production phase, components 404 and 408 may be removed, component 409 may be replaced by a short circuit, and the same configuration shown in FIG. 6 may be used. During this inference phase, an analog input signal is applied to DUT sigma-delta ADC 401, which produces a digital output signal that is then modified by trained neural network 402 to produce a compensated or calibrated corrected output signal, which may then be utilized by other circuitry.

Accordingly, in various systems and methods described herein, the use of filter G 106, 206, 306, and 406 reduces the out-of-band noise of a DUT sigma delta ADCs 101, 201, 301, and 401, respectively. The filtering prevents excessive noise folding in neural networks 102, 202, 302, and 402, and it prevents the out-of-band quantization noise from interfering with the learning process of neural networks 102, 202, 302, and 402. In that way, a post-compensation scheme for ADCs using neural networks is made suitable for sigma delta modulators. Moreover, in some embodiments, systems and methods described herein may replace reference ADCs 103 and 203 with digital filters F 309 and 409.

In some cases, coefficients needed for neural networks 102, 202, 302, and 402 may be determined in a simulation (e.g., MATLAB) offline using measurement data. The analog input signal is not needed at the time of determining the coefficients. Instead, it may be reconstructed from the data itself. The neural network coefficients can be uploaded to the product during final test.

In accordance with embodiments of the present disclosure, the training and validation phases described herein with respect to FIGS. 1, 5, 8, and 9 may be performed in a way that the various components are implemented on or off an IC. In a first example, a test chip of the DUT ADC may be produced, and a pre-selected number of samples may be measured. With this data, a neural network may be trained in software. Next, the trained neural network (with fixed biases and weights) together with the DUT ADC may be implemented into a product (e.g., an IC). In a second example, the DUT ADCs, reference ADCs, and neural networks may be all implemented on an IC, but the reference ADCs may only be used to train the neural networks and are powered down during the end-use application of the IC. In a third example, the DUT ADCs and the neural networks may be implemented on an IC, but not the reference ADCs, which are mounted on a test board for the training and validation phases.

It will also be noted that each block of the block diagrams, and combinations of blocks in the block diagrams can be implemented by special purpose hardware-based systems (e.g., which may include one or more graphics processing units) that perform the specified operations or acts, or combinations of special purpose hardware and computer instructions. For example, a module (e.g., neural networks 102, 202, 302, and 402, and cost functions 104, 204, 304, and 404) may be implemented as a hardware circuit including custom VLSI circuits or gate arrays, off-the-shelf semiconductors such as logic chips, transistors, controllers, or other discrete components. Such a module may also be implemented in programmable hardware devices such as field programmable gate arrays, programmable array logic, programmable logic devices, application specific ICs, microcontrollers, systems on a chip, general purpose processors, microprocessors, or the like.

Computer program code (i.e., instructions, for carrying out operations) may be written in any combination of one or more programming languages, including an object-oriented programming language such as Java, Smalltalk, Python, C++, or the like, conventional procedural programming languages, such as the "C" programming language or similar programming languages, or any of machine learning software.

These program instructions may also be stored in a computer readable storage medium that can direct a computer system, other programmable data processing apparatus, controller, or other devices to operate in a particular manner, such that the instructions stored in the computer readable medium produce an article of manufacture including instructions which implement the operations specified in the block diagram block or blocks.

The program instructions may also be loaded onto a computer, other programmable data processing apparatus, controller, or other devices to cause a series of operations to be performed on the computer, or other programmable apparatus or devices, to produce a computer implemented process such that the instructions upon execution provide processes for implementing the operations specified in the block diagram block or blocks.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules and may be embodied in any suitable form and organized within any suitable type of data structure. The operational data may be collected as a single data set or may be distributed over different locations including over different storage devices.

Systems and methods for correction of sigma-delta ADCs using neural networks are described. In an illustrative, non-limiting embodiment, a device may include: an ADC; a filter coupled to the ADC, where the filter is configured to receive an output from the ADC and to produce a filtered output; and a neural network coupled to the filter, where the neural network is configured to receive the filtered output and to produce a corrected output.

In some implementations, the ADC may include a delta-sigma ADC. The may be configured to reduce out-of-band frequency content of the output. The neural network may be configured to receive a PVT parameter and to produce the corrected output based, at least in part, upon the PVT parameter.

The device may also include: a reference ADC configured to receive an analog input provided to the ADC and to produce a target output; and another filter coupled to the reference ADC, where the other filter is configured to receive the target output and to produce a filtered target output. To produce the corrected output, the neural network may be trained with a difference between corrected outputs and filtered target outputs.

The device may further include: a delay circuit coupled between the filter and the neural network, wherein the delay circuit is configured to apply a time delay to the filtered output; and another filter coupled between the filter and the delay circuit, where the other filter is configured to receive the filtered output and to produce a target output, and where the time delay is configured to synchronize the filtered output with the target output.

The filter may be configured to reduce quantization noise of the output, and the other filter may be configured to reduce harmonic distortion of the filtered output. To produce the corrected output, the neural network may be trained with a difference between corrected outputs and target outputs.

In another illustrative, non-limiting embodiment, a device may include: an ADC; a filter coupled to the ADC, wherein the filter is configured to receive an output from the ADC and to produce a filtered output; and a neural network coupled to the filter, where the neural network is configured to receive the filtered output and to predict an error that, subtracted from the filtered output, produces a corrected output.

In some implementations, the ADC may include a delta-sigma ADC. The filter may be configured to remove out-of-band frequency content of the output. The neural network may be further configured to receive a digital representation of a PVT parameter and to predict the error based, at least in part, upon the digital representation of the PVT parameter.

The device may also include another filter coupled to a digital representation of a reference ADC output, wherein the other filter is configured to receive the digital representation of the reference ADC output and to produce an intermediate output, and wherein the intermediate output subtracted from the filtered output produces a target output. To predict the error, the neural network may be trained with a difference between predicted errors and target outputs.

The device may further include: a delay circuit coupled between the filter and the neural network, where the delay circuit is configured to apply a time delay to the filtered output to produce a delayed, filtered output; and another filter coupled between the filter and the delay circuit, where the other filter is configured to receive the filtered output and to produce an intermediate output, where the intermediate output subtracted from the delayed, filtered output produces a target output, and where the time delay is configured to synchronize the delayed, filtered output with the target output.

The filter may be configured to reduce quantization noise of the output, and the other filter may be configured to reduce harmonic distortion of the filtered output. To predict the error, the neural network may be trained with a difference between predicted errors and target outputs.

In yet another illustrative, non-limiting embodiment, a method may include: receiving an analog input at an ADC; and producing a digital output by the ADC, where the ADC is coupled to a neural network via a filter, where the filter is configured to reduce out-of-band frequency content of the digital output, and where the neural network is configured to produce at least one of: (a) a corrected digital output; or (b) a predicted error. In some implementations, the ADC may include a delta-sigma ADC.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, IoT devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A device, comprising:
 an analog-to-digital converter (ADC);
 a filter coupled to the ADC, wherein the filter is configured to receive an output from the ADC and to produce a filtered output; and
 a neural network coupled to the filter, wherein the neural network is configured to receive the filtered output and to produce a corrected output.

2. The device of claim 1, wherein the ADC comprises a delta-sigma ADC.

3. The device of claim 1, wherein the filter is configured to reduce out-of-band frequency content of the output.

4. The device of claim 1, wherein the neural network is further configured to receive a Process-Voltage-Temperature (PVT) parameter and to produce the corrected output based, at least in part, upon the PVT parameter.

5. The device of claim 1, further comprising:
 a reference ADC configured to receive an analog input provided to the ADC and to produce a target output; and
 another filter coupled to the reference ADC, wherein the other filter is configured to receive the target output and to produce a filtered target output.

6. The device of claim 5, wherein to produce the corrected output, the neural network is trained with a difference between corrected outputs and filtered target outputs.

7. The device of claim 1, further comprising:
a delay circuit coupled between the filter and the neural network, wherein the delay circuit is configured to apply a time delay to the filtered output; and
another filter coupled between the filter and the delay circuit, wherein the other filter is configured to receive the filtered output and to produce a target output, and wherein the time delay is configured to synchronize the filtered output with the target output.

8. The device of claim 7, wherein the filter is configured to reduce quantization noise of the output, and wherein the other filter is configured to reduce harmonic distortion of the filtered output.

9. The device of claim 7, wherein to produce the corrected output, the neural network is trained with a difference between corrected outputs and target outputs.

10. A device, comprising:
an analog-to-digital converter (ADC);
a filter coupled to the ADC, wherein the filter is configured to receive an output from the ADC and to produce a filtered output; and
a neural network coupled to the filter, wherein the neural network is configured to receive the filtered output and to predict an error that, subtracted from the filtered output, produces a corrected output.

11. The device of claim 10, wherein the ADC comprises a delta-sigma ADC.

12. The device of claim 10, wherein the filter is configured to remove out-of-band frequency content of the output.

13. The device of claim 10, wherein the neural network is further configured to receive a digital representation of a Process-Voltage-Temperature (PVT) parameter and to predict the error based, at least in part, upon the digital representation of the PVT parameter.

14. The device of claim 10, further comprising another filter coupled to a digital representation of a reference ADC output, wherein the other filter is configured to receive the digital representation of the reference ADC output and to produce an intermediate output, and wherein the intermediate output subtracted from the filtered output produces a target output.

15. The device of claim 14, wherein to predict the error, the neural network is trained with a difference between predicted errors and target outputs.

16. The device of claim 10, further comprising:
a delay circuit coupled between the filter and the neural network, wherein the delay circuit is configured to apply a time delay to the filtered output to produce a delayed, filtered output; and
another filter coupled between the filter and the delay circuit, wherein the other filter is configured to receive the filtered output and to produce an intermediate output, wherein the intermediate output subtracted from the delayed, filtered output produces a target output, and wherein the time delay is configured to synchronize the delayed, filtered output with the target output.

17. The device of claim 16, wherein the filter is configured to reduce quantization noise of the output, and wherein the other filter is configured to reduce harmonic distortion of the filtered output.

18. The device of claim 16, wherein to predict the error, the neural network is trained with a difference between predicted errors and target outputs.

19. A method, comprising:
receiving an analog input at an analog-to-digital converter (ADC); and
producing a digital output by the ADC, wherein the ADC is coupled to a neural network via a filter, wherein the filter is configured to reduce out-of-band frequency content of the digital output, and wherein the neural network is configured to produce at least one of: (a) a corrected digital output; or (b) a predicted error.

20. The method of claim 19, wherein the ADC comprises a delta-sigma ADC.

* * * * *